United States Patent
Hwang et al.

(10) Patent No.: US 6,900,629 B2
(45) Date of Patent: May 31, 2005

(54) GROUP WIRING DEVICE FOR FACILITATING WIRE PAIR IDENTIFICATION

(76) Inventors: Richard Hwang, Nei-Hu P.O. Box 6-105, Taipei (TW); Memiee Hwang, Nei-Hu P.O. Box 6-105, Taipei (TW); Wayne Hwang, P.O. Box 8242, Goleta, CA (US) 93118; Jim Hwang, 6699 Beadnell Way #120, San Diego, CA (US) 92117

( * ) Notice: Subject to any disclaimer, the term of this patent is extended or adjusted under 35 U.S.C. 154(b) by 0 days.

(21) Appl. No.: 10/354,391

(22) Filed: Jan. 31, 2003

(65) Prior Publication Data

US 2004/0152351 A1 Aug. 5, 2004

(51) Int. Cl.[7] .......................... G01R 19/00; H01R 4/60; H04M 1/24
(52) U.S. Cl. ...................... 324/158.1; 324/66; 439/195; 379/9
(58) Field of Search ................ 324/66, 158.1; 379/1.01–35; 439/188

(56) References Cited

U.S. PATENT DOCUMENTS

| | | | | |
|---|---|---|---|---|
| 4,575,588 A | * | 3/1986 | Vande Vyver | 379/22 |
| 4,626,633 A | * | 12/1986 | Ruehl et al. | 379/27.08 |
| 5,764,725 A | * | 6/1998 | Martin et al. | 379/22.07 |
| 5,847,557 A | * | 12/1998 | Fincher et al. | 324/66 |

* cited by examiner

Primary Examiner—Michael Tokar
Assistant Examiner—Emily Y Chan

(57) ABSTRACT

A group wiring device which has built-in light emitting means and switch mechanism coupled with wire pair receptacle thereof. The switch mechanism is normally on a "CLOSE" status but can be switched to an "OPEN" status when a plug mates with the wire pair receptacle. When the switch mechanism is "CLOSE" and a testing voltage is applied to the circuit of the light emitting means, the light emitting means will emit light for assisting wire pair identification. After the process of wire pair identification is complete, the group wiring device is deemed to be in normal operation, that is, to perform ordinary signal transmitting functions. The wire pair receptacle will then be mated with plug of network cable so as to drive the switch mechanism to become "OPEN". Therefore, the circuit of light emitting means becomes an open circuit and provides no function at all. As a result, the built-in light emitting means and switch mechanism of the present invention will not result in "loop back shorting" nor disrupt the communication at all.

6 Claims, 6 Drawing Sheets

GROUP WIRING DEVICE FOR FACILITATING WIRE PAIR IDENTIFICATION

1. FIELD OF THE INVENTION

This invention relates to sorting electrical conductors, particularly to an improved group wiring device such like a patch panel which can be used with a voltage supplier for wire pair identification.

2. BACKGROUND OF THE INVENTION

It is often necessary to identify individual wires or circuits which extend between two locations. Please refer to FIG. 1. For example, a typical communication system such as internet service provider system, local area network (LAN) system, wide area network (WAN) system, metropolitan area network (MAN) system, intranet networking system, or telephone work center usually involves in hundreds or even thousands of end users located at different sites or places sharing the service (or controlled by) provided by the same server system 10. Some end users 11 may connect to the server system 10 from the internet 111 through a modern system 112. Some end users 12 may connect to the server system 10 via local servers 121 which may be far away from the server system 10. Some end users 13 may connect to the server system 10 by using hubs 131 which may be located in the same building but different floors of the server system 10. Some end users 14 may connect to the server system 10 through a jack 141 or socket near their working tables. Some end users 15 may use wireless networking devices 151 and wireless hubs 152 to access the server system 10. It is also available or sometimes necessary to connect the server system 10 with another communication system 10a. Most of above mentioned end users require "wires" or "cables" for connection with the server system 10. As a result, the wiring system is concerned. In the wiring system, thousands of wires coming from different locations are gathered and then connected to a distribution frame 20, such like a patch panel stack, before connecting to the server system 10. It is obvious that management of the wires would be a critical issue for such a large wiring system. For example, to identify which jack 211 on the patch panel 21 is connected to which end user located at what remote location. Conventional way to identify wire pairs in the wiring system requires two workers. One worker is stationed at the patch panel stack (distribution frame 20) while the other is stationed at one of the remote end-user locations. The worker at the remote end-user location uses an equipment to generate a test signal to the wires there. The worker at the patch panel stack uses a speaker device and sequentially plugging the speaker device into every jack on the panels until the speaker device is energized by the test signal and generate a test tone. The wire pair which makes the test tone is then identified and labeled. This process is repeated until all wire pairs are identified. It is obvious that such a conventional wire pair identification method is very laboring and time-wasting. In a large wiring system, it may take days or even weeks to perform wire pair identification.

U.S. Pat. No. 5,847,557 disclosed a method to identify wire pairs in a wiring system. Before starting the wire pair identification, each of the jacks on the patch panel stack (distribution frame) is plugged up with an indicator plug which has a LED inside. By applying a test voltage from a remote end-user location, the indicator plug which connects to that remote end-user location is energized and thus the LED inside is driven to light. As a result, the wire pair is identified. Since workers do not need to sequentially scan every patch panel jacks for each remote end-user location jack manually, time consumption and labor cost are reduced. However, there are still deficiencies for the prior art method disclosed in U.S. Pat. No. 5,847,557. For example, it requires workers to apply lots of indicator plugs to every one of the jacks on the patch panel stack before starting to apply the test voltage, and to remove all of the indicator plugs after the wire pair identification process is completed. Time waste still exists. In addition, it is impossible for U.S. Pat. No. 5,847,557 to directly built-in the LEDs inside the jacks of the patch panel because the LED circuit will incur a short circuit between two contacts of the jack. And, once the patch panel stack is under normal operation such as transmission of communication signals, the LED circuit will result in "loop back shorting" and seriously disrupt the communication. Therefore, it leaves a room for further improvements.

SUMMARY OF THE INVENTION

The primary object of the present invention is to provide a group wiring device which has built-in light emitting means and switch mechanism coupled with wire pair receptacle thereof. The switch mechanism is normally on a "CLOSE" status but can be switched to an "OPEN" status when a plug mates with the wire pair receptacle. When the switch mechanism is "CLOSE" and a testing voltage is applied to the circuit of the light emitting means, the light emitting means will emit light for assisting wire pair identification. After the process of wire pair identification is complete, the group wiring device is deemed to be in normal operation, that is, to perform ordinary signal transmitting functions. The wire pair receptacle will then be mated with plug of network cable so as to drive the switch mechanism to become "OPEN". Therefore, the circuit of light emitting means becomes an open circuit and provides no function at all. As a result, the built-in light emitting means and switch mechanism of the present invention will not result in "loop back shorting" nor disrupt the communication at all.

Preferably, the light emitting means comprises two individual LED members connected in parallel but in reverse polarities. Therefore, no matter which direction of current of the DC testing voltage is applied, one of the LED members will be lit. Moreover, the two LED members can be different colors such that, by distinguishing the color of emitted light, it is possible to know if the wires are mis-connected while performing the wire pair identification.

DETAILED DESCRIPTION OF THE INVENTION

The primary object of the present invention is to provide a group wiring device which has built-in light emitting means and switch mechanism coupled with wire pair receptacle thereof. The switch mechanism is normally on a "CLOSE" status but can be switched to an "OPEN" status when a plug mates with the wire pair receptacle. When the switch mechanism is "CLOSE" and a testing voltage is applied to the circuit of the light emitting means, the light emitting means will emit light for assisting wire pair identification. After the process of wire pair identification is complete, the group wiring device is deemed to be in normal operation, that is, to perform ordinary signal transmitting functions. The wire pair receptacle will then be mated with plug of network cable so as to drive the switch mechanism to become "OPEN". Therefore, the circuit of light emitting means becomes an open circuit and provides no function at all. As a result, the built-in light emitting means and switch mechanism of the present invention will not result in "loop back shorting" nor disrupt the communication at all.

Following are detailed descriptions of some preferred embodiments of the group wiring device and system in accordance with the present invention.

Figure 1:
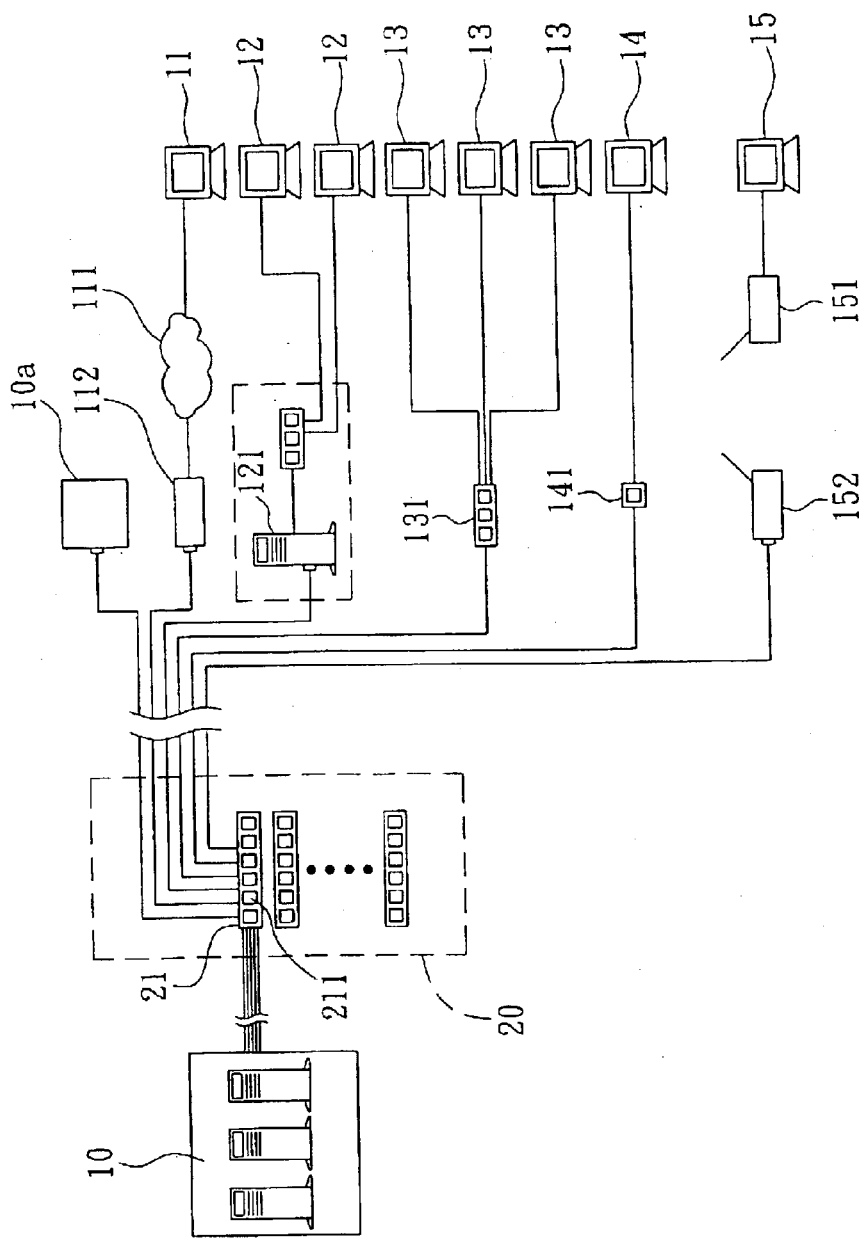
FIG. 1 is a schematic drawing showing a typical example of the relationship between a conventional communication system and end users.
Figure 2:
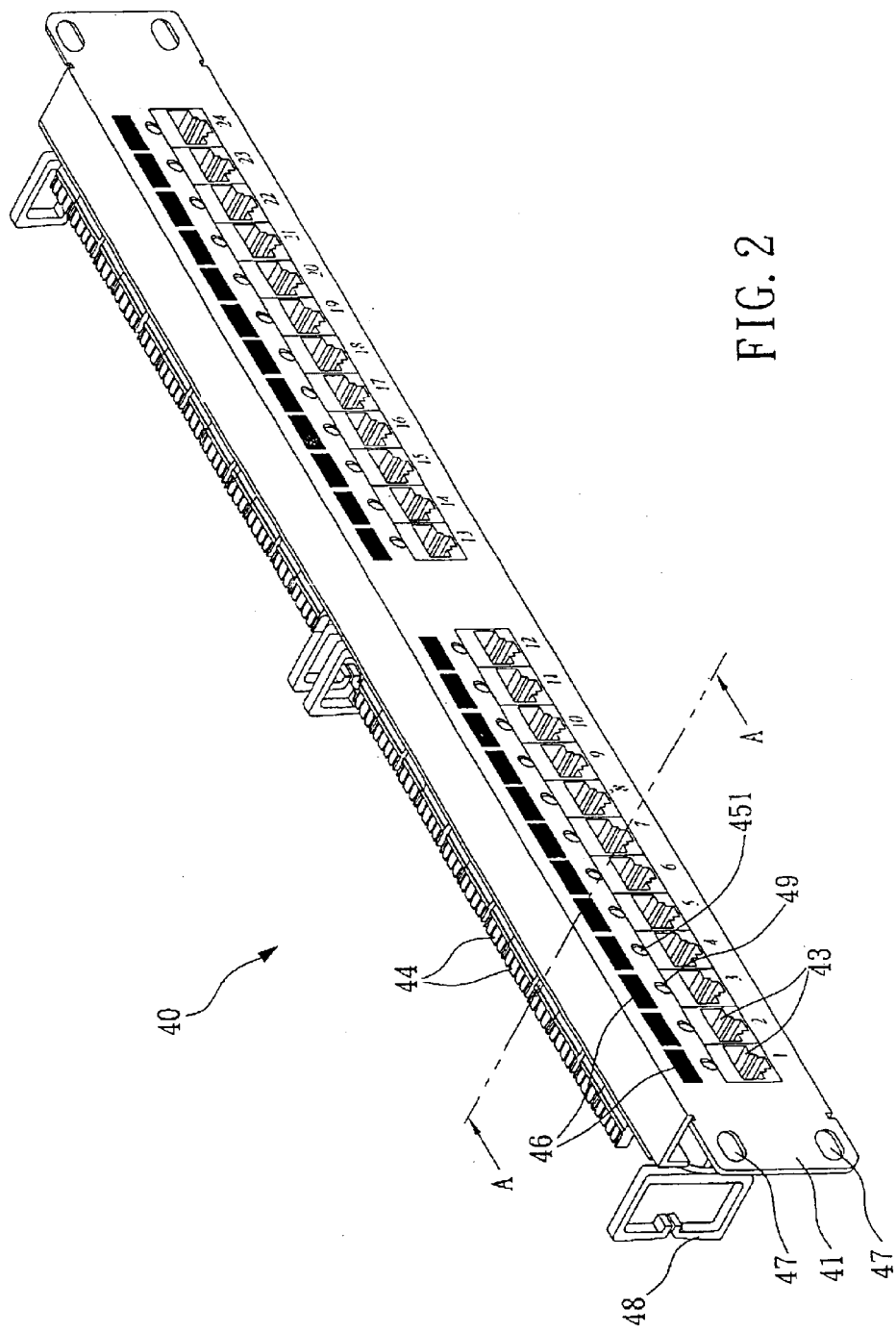
FIG. 2 is a schematically perspective view of a preferred embodiment of the group wiring device of the present invention.
Figure 3:
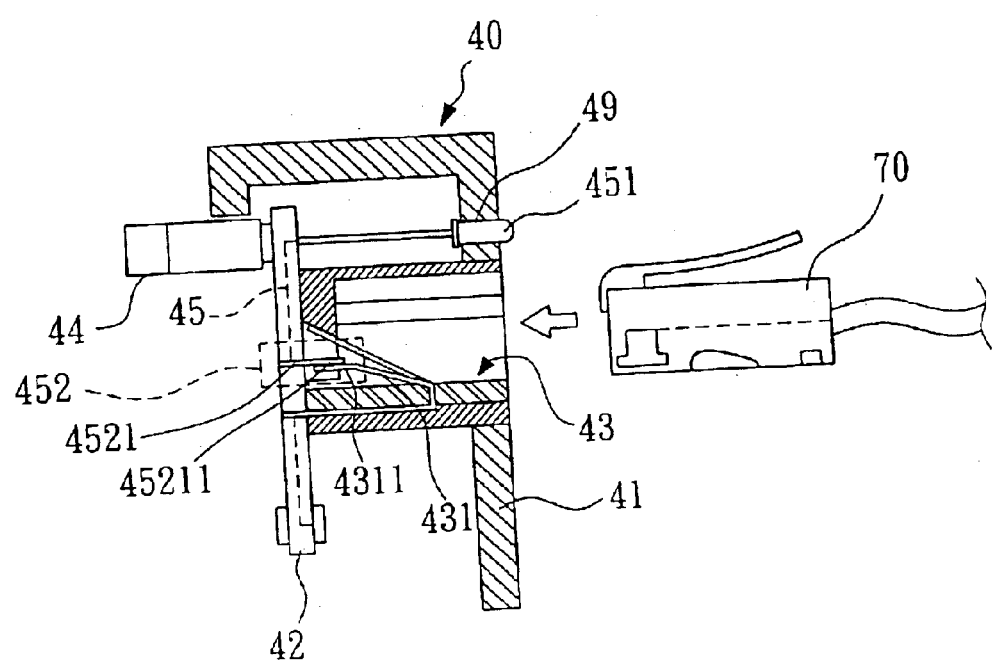
FIG. 3 a schematically A—A section view of FIG. 2 wherein the plug 70 is not mated with the receptacle 43.
Figure 4:
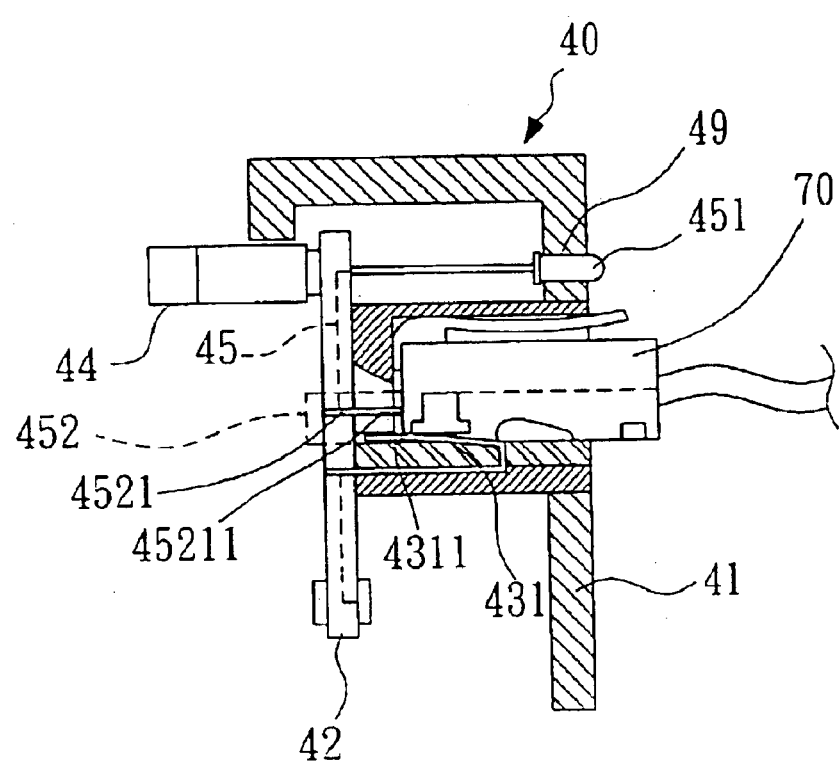
FIG. 4 is similar to FIG. 3 but the plug 70 is mated with the receptacle 43.

Please refer to FIG. 2, FIG. 3 and FIG. 4, wherein a schematically perspective view and schematically A—A section views of a preferred embodiment of the group wiring device 40 of the present invention are shown. In this preferred embodiment, the group wiring device 40 is in a type of patch panel. However, it is obvious to those skilled in the art that it can also be a type choosing from a group comprising: patch panel, wiring termination block, jack-type patch box, block-type patch box, floor outlet, distribution frame (DF), and wiring module.

The group wiring device 40 (or also can be referred as patch panel hereafter) comprises a panel 41, a circuit board 42 fixed to the panel 41, a plurality of jack-typed wire pair receptacles 43 furnished on the panel 41 and connected to the circuit board 42, a plurality of Insulation Displacement Contact (IDC) blocks 44 connected to the circuit board 42 and opposed to the wire pair receptacles 43, and a plurality of testing circuits 45 formed on the circuit board 42 and coupled with the wire pair receptacles 43 respectively. Labeling areas 46 are formed on the front surface of the panel 41 for labeling the wire pair receptacles 43. The panel 41 provides a supporting function for the wire pair receptacles 43 and the circuit board 42. There are some mechanisms such as screw holes 47 and cable management rings 48 for allowing the panel 41 to be fixed to a desired location such like a case, a frame or a rack (not shown in figures).

Each of the wire pair receptacles 43 further comprises at least two contacts 431, 432 (only contact 431 is shown in FIGS. 3 and 4, the other contact 432 please refer to FIG. 5 or 6) each connecting with a conductive wire (not shown in this figure) formed on the circuit board 42. Each testing circuit 45 is coupled between the conductive wires of a corresponsive wire pair receptacle 43 and is further comprising a light emitting means 451 and a switch mechanism 452. The light emitting means 451 is able to emit light when a testing voltage being applied to the light emitting means 451. The switch mechanism 452 is serially connected with the light emitting means 451 on the testing circuit 45 and can be switched between an "OPEN" status and a "CLOSE" status.

In the preferred embodiment shown in FIGS. 3 and 4, the switch mechanism 452 comprises at least one metal stick 4521 having its one end connected with the testing circuit 45 and the other end being a free end 45211 protruding inside the wire pair receptacle 43. The contact 431 is a flexible V-shaped contact pin. One end of the pin (i.e., contact 431) is connected with the conductive wire, while the other end is a bendable free end 4311 contactable with the free end 45211 of the metal stick 4521 of the switch mechanism 452. When there is no plug 70 being received within the wire pair receptacle 43 as which shown in FIG. 3, the bendable free end 4311 of the pin (contact 431) keeps contact with the free end 45211 of the metal stick 4521 due to resilient force of its own. When the plug 70 is mated with the wire pair receptacle 43 as shown in FIG. 4, the to bendable free end 4311 of the pin (contact 431) will be pressed and bended by the plug 70 and thus lose contact with the metal stick 4521. Therefore, it is understood that, the switch mechanism 452 of the present invention will remain on the "CLOSE" status when there is no plug 70 received in the wire pair receptacle 43 (as which shown in FIG. 3). And, when the plug 70 is mated with the wire pair receptacle 43, as shown in FIG. 4, the switch mechanism 452 will be switched to the "OPEN" status.

In this preferred embodiment, the light emitting means 451 can be a light emitting diode (LED). The panel 41 is formed with a plurality of holes 49 on a front surface thereof for receiving the light emitting means 451 such that at least part of the light emitted by said light emitting means 451 can be exposed out of the front surface of the panel 41.

In the following description, most elements are the same with or similar to the above mentioned embodiment. Therefore, same elements are provided with same numerals without further descriptions and illustrations.

Figure 5:
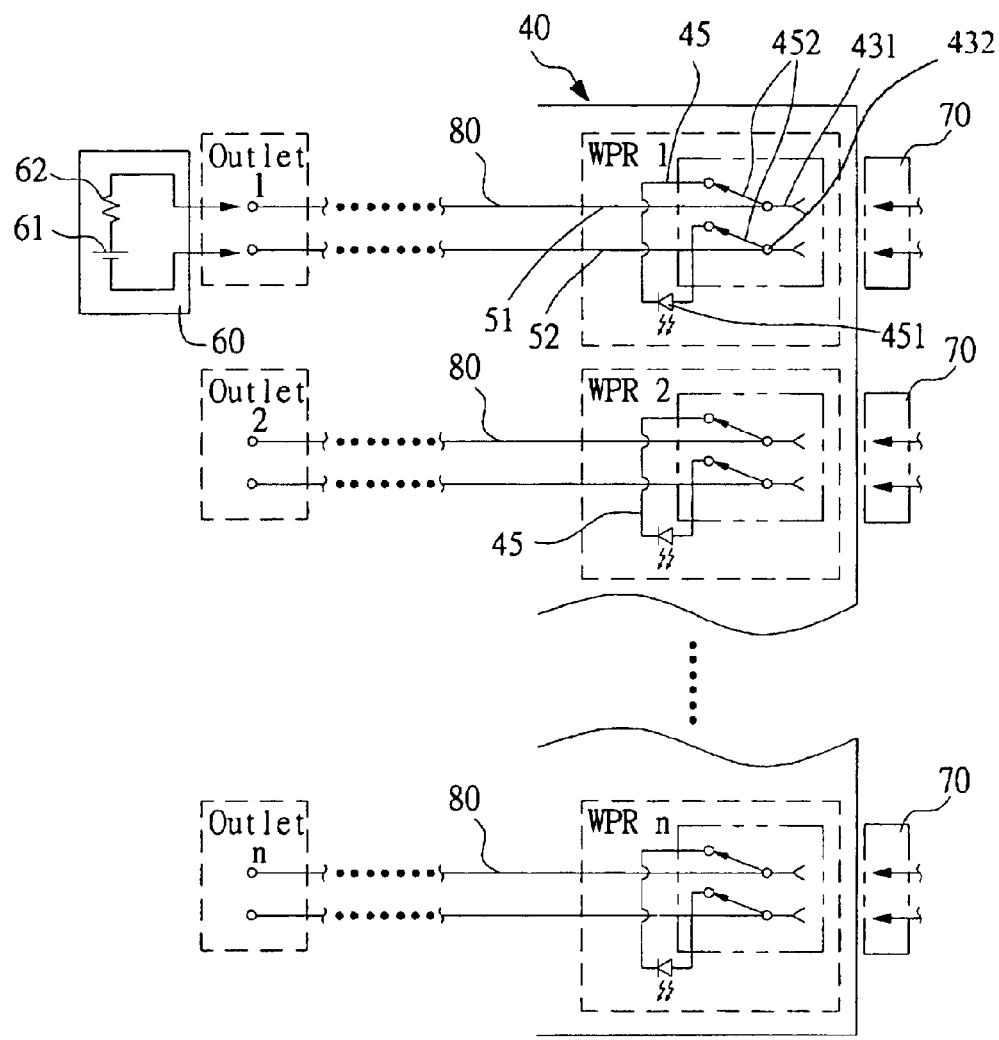
FIG. 5 is a schematic drawing of a preferred embodiment of the testing circuits of the group wiring device in co-operation with a cable tester in accordance with the present invention.

FIG. 5 illustrates a first preferred embodiment of the testing circuits 45 of the group wiring device 40 in co-operation with a cable tester 60 to perform wire pair identification process. Wherein the symbols WPR1, WPR2 . . . WPRn represent the testing circuits 45 connected with the corresponsive wire pair receptacles 43 (WPR) of the group wiring device 40. The symbols Outlet1, Outlet2 . . . Outlet n schematically represent other wire pair receptacles (can also be referred as local receptacles) which are located remote from the group wiring device 40 and may not be located at same place. These remote wire pair receptacles Outlet1, Outlet2 . . . Outlet n are connected with wire pair receptacles WPR1, WPR2 . . . WPRn by wires or cables 80. It is noted that the remote wire pair receptacles can be jack-typed or plug-typed and may be furnished on a modem system, local server, hub, wall jack, wireless networking device, or another communication system. In the first embodiment shown in FIG. 5, the cable tester 60 includes a DC battery 61 and a resistor 62 and can simply provide a DC testing voltage from one of the remote wire pair receptacles Outlet1, Outlet2 . . . Outlet n.

In this first preferred embodiment of the testing circuit 45 in accordance with the present invention, the testing circuit 45 is coupled between two conductive wires 51,52 of two contacts 431,432 of the wire pair receptacle 43 of the group wiring device 40. There is at least one light emitting means 451 (e.g., LED) and at least one switch mechanism 452 serially connected with light emitting means 451. One preferred embodiment of the switch mechanism 452 has been shown and illustrated in FIGS. 3 and 4. As previously described, when the plug 70 is not mated with the wire pair receptacles (WPR) 43, the switch mechanism 452 will be on the "CLOSE" status. In the mean time, if we use the cable tester 60 to mate with one of the remote wire pair receptacles (Outlet), for example, Outlet 1 shown in FIG. 5, then the cable tester 60 and the testing circuit 45 will form a "close loop". Therefore, the DC battery 61 of the cable tester 60 will energize the light emitting means 451 to make it lit. As a result, the corresponding wire pair between the local receptacles and the wire pair receptacles can be identified by the light.

On the other hand, when the wire pair identification process is completed, the group wiring device 40 is deemed to perform its normal function, that is, to perform ordinary signal transmitting functions. The wire pair receptacles 43 will then be mated with plugs 70 of network cable for signal transmission. Therefore, the insertion of plug 70 will drive the switch mechanism 452 to become "OPEN". The testing circuit 45 and the light emitting means 451 become "open circuit" and provide no function even if DC voltages or communicating signals are applied to them. As a result, the built-in light emitting means 451 and switch mechanism 452 of the present invention will not result in "loop back shorting" nor disrupt the communication at all.

Figure 6:
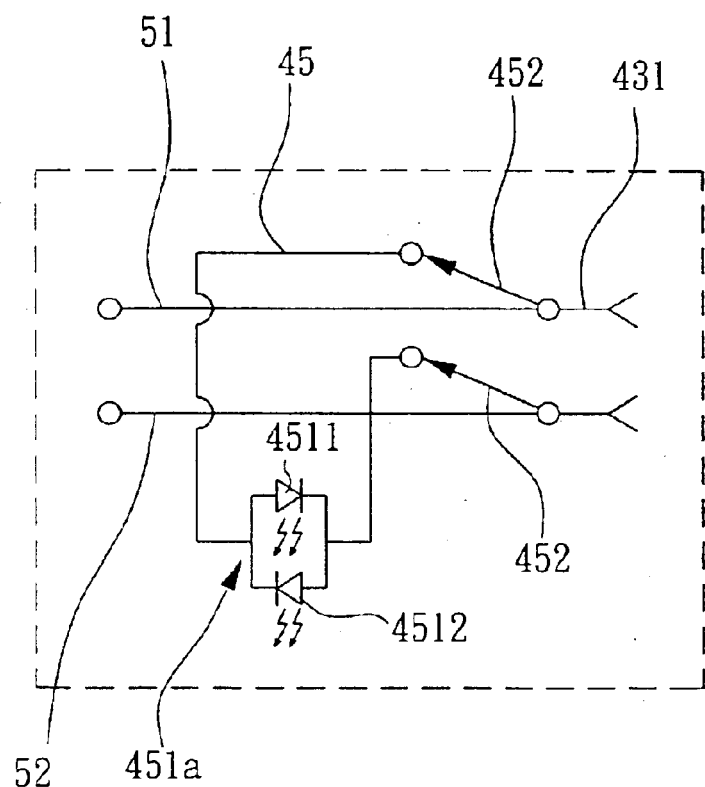
FIG. 6 illustrates a second preferred embodiment of the testing circuit of the group wiring device of the present invention.

Referring to FIG. 6, which illustrates a second preferred embodiment of the testing circuit 45a of the group wiring patching device of the present invention. The testing circuit 45a is also coupled between two contacts 431,432 of a wire pair receptacle and also including serially connected light emitting means 451a and switch mechanism 452. The only difference between this second preferred embodiment and the one shown in FIG. 5 is that, in the embodiment shown in FIG. 6, the light emitting means 451a comprises two individual LED (light emitting diode) members 4511,4512 connected in parallel but in reverse polarities. Therefore, no matter which direction of current of the DC testing voltage is applied by the cable tester 60, one of the LED members 4511,4512 will be lit. Moreover, the two LED members 4511,4512 can be different colors such that, by distinguishing the color of emitted light, it is possible to know if the wires 51,52 are mis-connected while performing the wire pair identification.

While the present invention has been shown and described with reference to a preferred embodiment thereof, and in terms of the illustrative drawings, it should be not considered as limited thereby. Various possible modifications, omissions, and alterations could be conceived of by one skilled in the art to the form and the content of any particular embodiment without departing from the scope and the spirit of the present invention.

What is claimed is:

1. A group wiring device for facilitating wire pair identification, said group wiring device comprising:
    a plurality of wire pair receptacles capable of receiving plugs, each receptacle further comprising at least two contacts each connecting with a conductive wire; and
    a plurality of testing circuits each testing circuit coupling between said conductive wires of said contacts of one receptacle and further comprising:
    at least one light emitting means connected on said testing circuit for emitting light when a testing voltage is applied to said light emitting means; and
    at least one switch mechanism connected with the light emitting means on said testing circuit and being switchable between an "OPEN" status and a "CLOSE" status;
    wherein, the switch mechanism remains on the "CLOSE" status when there is no plug received in the receptacle, and the switch mechanism switches to the "OPEN" status when there is a plug mated with the receptacle;
    wherein the switch mechanism comprises at least one metal stick having one end thereof connected with the light emitting means, the contact is a flexible contact pin, one end of the pin is coupled with the light emitting means, while the other end is a bendable end contactable with the metal stick of the switch mechanism the bendable end of the pin keeps contact with the metal stick when no plug is received in the receptacle so as to make the circuit of the light emitting means to be a close loop, and when the plug is plugged in the receptacle, the bendable end of the pin is pressed and bended by the plug and thus lose contact with the metal stick so as to make the circuit of the light emitting means to be an open circuit.

2. The group wiring device of claim 1, wherein said group wiring device further comprises a panel and a circuit board for furnishing said testing circuit, said light emitting means and said switch mechanism; wherein said panel supports said wire pair receptacles and the circuit board; wherein at least part of light emitted by said light emitting means is exposed out of a front surface of the panel.

3. The group wiring device of claim 2, wherein said light emitting means comprises two individual LED members connected in parallel but in reverse polarities.

4. A group wiring system for wire pair identification comprising:
    a tester for supplying a testing voltage;
    a group wiring device comprising a plurality of wire pair receptacles, each wire pair receptacle having at least two contacts and being coupled with at least one light emitting means and a switch mechanism, the light emitting means being coupled between said contacts, said switch mechanism being coupled with the light emitting means between said contacts and being switchable between a "OPEN" status and a "CLOSE" status;
    at least one local receptacle being located remote from said group wiring device, said local receptacles having at least two contacts; and
    means for electrically coupling said contacts of said local receptacles with said contacts of said wire pair receptacles so as to define wire pairs between the local receptacles and wire pair receptacles;
    wherein, the switch mechanism remains on the "CLOSE" status when there is no plug mated with the wire pair receptacle, and the switch mechanism switches to the "OPEN" status when there is a plug mated with the wire pair receptacle;
    wherein, said tester supplying said testing voltage to one of the local receptacles causing the light emitting means of the wire pair receptacle which is coupled with that local receptacle to light when the switch mechanism is on the "CLOSE" status so as to identity the corresponding wire pair between the local receptacles and the wire pair receptacles;
    wherein, when the switch mechanism is on the "OPEN" status, circuit of the light emitting means becomes an open circuit, and the light emitting means will not light no matter if there is testing voltage applied thereto or not;
    wherein the switch mechanism comprises at least one metal stick having one end thereof connected with the light emitting means, the contact is a flexible contact pin, one end of the pin is coupled with the light emitting means, while the other end is a bendable end contactable with the metal stick of the switch mechanism, the bendable end of the pin keeps contact with the metal stick when no plug is received in the receptacle so as to make the circuit of the light emitting means to be a close loop, and when the plug is plugged in the receptacle, the bendable end of the pin is pressed and bended by the plug and thus lose contact with the metal stick so as to make the circuit of the light emitting means to be an open circuit.

5. The group wiring system of claim 4, wherein said group wiring device further comprises a panel and a circuit board for furnishing said light emitting means and said switch mechanism; wherein said panel supports said wire pair receptacles and the circuit board; wherein at least part of light emitted by said light emitting means is exposed out of a front surface of the panel.

6. The group wiring system of claim 5, wherein said light emitting means comprises two individual LED members connected in parallel but in reverse polarities.

* * * * *